United States Patent [19]
Kikuchi et al.

[11] Patent Number: 6,084,813
[45] Date of Patent: Jul. 4, 2000

[54] APPARATUS AND METHOD FOR CONTROLLING MEMORY BACKUP USING MAIN POWER SUPPLY AND BACKUP POWER SUPPLY

[75] Inventors: Akitoshi Kikuchi, Abiko; Katsutoshi Ushida, Kawasaki, both of Japan

[73] Assignee: Canon Kabushiki Kaisha, Tokyo, Japan

[21] Appl. No.: 09/323,022

[22] Filed: Jun. 1, 1999

[30] Foreign Application Priority Data

Jun. 4, 1998 [JP] Japan .................................. 10-155458
Jan. 20, 1999 [JP] Japan .................................. 11-011323

[51] Int. Cl.$^7$ .................................................. G11C 7/00
[52] U.S. Cl. .......................................... 365/222; 365/228
[58] Field of Search .................................. 365/222, 228, 365/233, 226

[56] References Cited

U.S. PATENT DOCUMENTS 5,495,452  2/1996  Cha ......................................... 365/222
5,712,825  1/1998  Hadderman et al. ..................... 365/222
5,867,438  2/1999  Nomura et al. .......................... 365/222

*Primary Examiner*—Tan T. Nguyen
*Attorney, Agent, or Firm*—Fitzpatrick, Cella, Harper & Scinto .

[57] ABSTRACT

In a system using a clock synchronous type synchronous DRAM (SDRAM), when a power supply voltage monitoring circuit informs a timing circuit of a decrease in voltage from a main power supply, the timing circuit outputs a self refresh request signal to a CPU. In response to the self refresh request signal, the CPU outputs a clock enable signal synchronous with the system clock, and a self refresh transfer command signal, which is expressed by a combination of states of memory access control signals, to the SDRAM, so as to start up self refresh of the SDRAM. After the self refresh has been started up, the CPU outputs a clock enable mask signal that masks the clock enable signal to switch a clock enable signal to be supplied to the SDRAM from the clock enable signal output from the CPU to a voltage detection signal of a backup power supply. A reset signal then outputs a reset signal to transfer to backup operation.

20 Claims, 10 Drawing Sheets

APPARATUS AND METHOD FOR CONTROLLING MEMORY BACKUP USING MAIN POWER SUPPLY AND BACKUP POWER SUPPLY

BACKGROUND OF THE INVENTION

1. Field of the Invention

The present invention relates to a memory backup control apparatus and method for controlling cutoff and recovery of a power supply with respect to a memory, which holds data, while selectively using a main power supply and backup power supply.

2. Related Background Art

In general, when data is backed up in a system that requires a large-capacity memory, a memory backup circuit uses a volatile memory such as a DRAM (dynamic random access memory) or the like as a memory element. A memory backup control apparatus may have a refresh circuit for restoring (rewriting) data to hold the data in the DRAM, a selector for switching between a system operation mode and backup mode upon refreshing the DRAM, a power supply voltage monitoring circuit for monitoring the power supply voltage of the system, and a backup power supply circuit for obtaining a voltage equal to the power supply voltage of the system.

In such arrangement, conventionally, transfer to backup operation is done as follows. That is, upon detecting a power supply voltage drop or decrease resulting from, e.g., power failure by the power supply voltage monitoring circuit, a reset signal is output to the system. At the same time, the selector is switched to the refresh circuit that operates in only the backup mode and the backup refresh circuit is started up. Alternatively, a CBR (CAS before RAS) timing is generated based on a RAS (row address strobe) signal and CAS (column address strobe) signal to start up self refresh of the DRAM. In this way, data is backed up.

Upon recovery of the power supply, after recovery of the power supply voltage is detected by the power supply voltage monitoring circuit, the system reset is canceled and, at the same time, the DRAM refresh circuit is switched from the backup side to the system side by the selector.

DRAM control upon transfer to or recovery from the backup control is done using a hardware timing asynchronous with the system clock.

Since the conventional memory backup control apparatus has the aforementioned arrangement, fast memory control is limited in a system that requires a large-capacity memory. Also, the CBR timing of the RAS and CAS signals must be generated by hardware or a gate array, and simple, fast control/processing cannot be implemented.

SUMMARY OF THE INVENTION

It is, therefore, an objective of the present invention to provide a memory backup control apparatus and method, which can quickly transfer to and recover from backup operation.

It is another objective of the present invention to provide a memory backup control apparatus and method, which assure high reliability upon switching power supplies.

According to one aspect, the present invention which achieves these objectives relates to an apparatus for controlling backup of a memory upon receiving a voltage from a main power supply or backup power supply, comprising: power supply voltage decrease detection means for detecting a decrease in voltage from the main power supply and outputting a voltage decrease detection signal; self refresh starting request means for outputting a self refresh starting request signal in response to the voltage decrease detection signal; and start-up control means for outputting a clock enable signal, and a self refresh transfer command signal, which is expressed by a combination of control signal line states with respect to the memory, to the memory in response to the self refresh starting request signal, so as to start up self refresh of the memory.

According to another aspect, the present invention which achieves these objectives relates to a method for controlling backup of a memory upon receiving a voltage from a main power supply or backup power supply, comprising the steps of: detecting a decrease in voltage from the main power supply and outputting a voltage decrease detection signal; outputting a self refresh starting request signal in response to the voltage decrease detection signal; and outputting a clock enable signal, and a self refresh transfer command signal, which is expressed by a combination of control signal line states with respect to the memory, to the memory in response to the self refresh starting request signal, so as to start up self refresh of the memory.

Other objectives and advantages besides those discussed above will be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for discriminating the scope of the invention.

BRIEF DESCRIPTION OF THE DRAWINGS

FIG. 9 is a flow chart showing an example of the processing sequence after main power supply is turned on.

DESCRIPTION OF THE PREFERRED EMBODIMENTS

A preferred embodiment of the present invention will be described in detail hereinafter with reference to the accompanying drawings.

Figure 1:
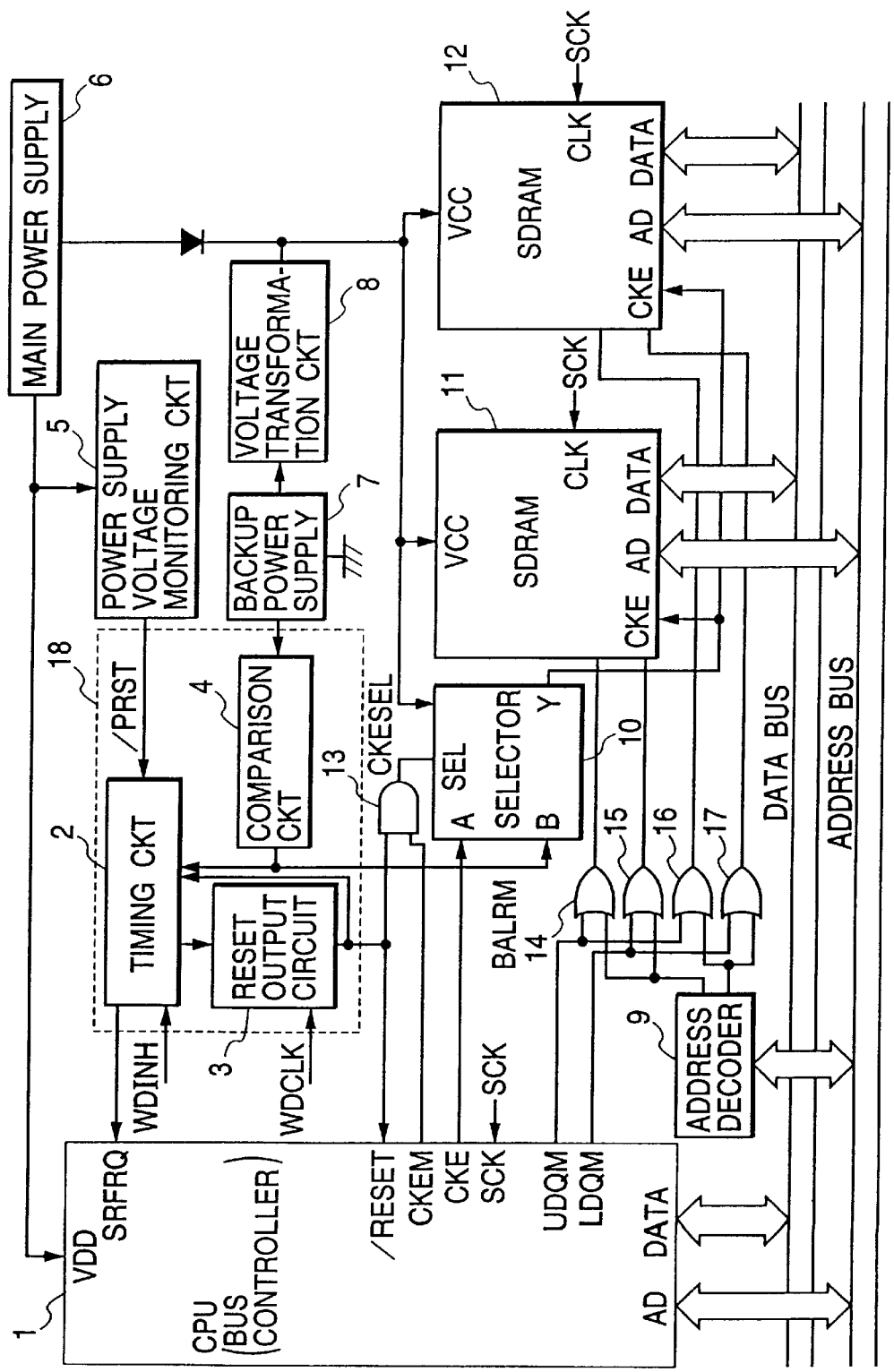
FIG. 1 is a block diagram showing the arrangement of a memory backup control apparatus according to an embodiment of the present invention.

FIG. 1 is a block diagram for explaining the arrangement of a memory backup control apparatus according to an embodiment of the present invention. In this embodiment, the control apparatus controls backup of a clock synchronous type SDRAM (synchronous DRAM).

Referring to FIG. 1, a CPU 1 serves as a bus controller, which controls memory access to SDRAMs 11 and 12 via a data bus DATABUS and address bus ADDRESSBUS. The CPU 1 changes a CKE (clock enable) signal to be output to a selector 10 to Low or High upon receiving a self refresh starting request (SRFRQ: High) or self refresh cancellation request (SRFRQ: Low) from a timing & logic circuit (to be referred to as a timing circuit hereinafter) 2. Also, the CPU 1 switches a CKEM (clock enable mask) signal to High or Low to switch the CKE signal in the selector 10.

The timing circuit 2 comprises a timing circuit and logic gate, and changes status of the SRFRQ signal and a reset signal of a reset output circuit 3 at prediscriminated timings in response to a power supply voltage decrease detection signal (/PRST signal: / indicates negative logic) from a power supply voltage monitoring circuit 5. The timing circuit 2 checks based on a WDINH signal if a low energy consumption mode is set. The reset output circuit 3 receives a WDCLK signal, has a clock monitoring function, and outputs a reset signal.

A comparison circuit 4 compares a voltage from a backup power supply 7 and a reference voltage, and outputs the comparison result to the timing circuit 2 and selector 10. The power supply voltage monitoring circuit 5 monitors the voltage from a main power supply 6, and detects a decrease state and recovery state. The main power supply 6 supplies system power from an AC commercial power supply or the like to the respective units.

The backup power supply 7 supplies power for backing up the SDRAMs 11 and 12. A voltage transformation circuit 8 converts the voltage from the backup power supply 7 into a power supply voltage VCC of the SDRAMs 11 and 12. An address decoder 9 interprets the address on the address bus ADDRESSBUS.

The selector 10 selects one of a CKE signal from the CPU side and a BALRM signal from the backup side as the CKE (clock enable) signal to the SDRAMs 11 and 12 in response to a CKESEL (clock enable select) signal, and outputs the selected signal.

The SDRAMs 11 and 12 comprise synchronous DRAMs, each of which receives a system clock SCK at its clock port CLK. An AND gate 13 ANDs the reset signal from the reset output circuit 3, and the CKEM signal from the CPU 1, and outputs the AND to the selector 10 as a CKESEL signal.

OR gates 14, 15, 16, and 17 OR the output from a UDQM or LDQM terminal of the CPU 1, and the output from the address decoder 9, and controls I/O data of the SDRAMs 11 and 12 using the ORs as data I/O mask (DQML/DQMU) signals.

Figure 2:
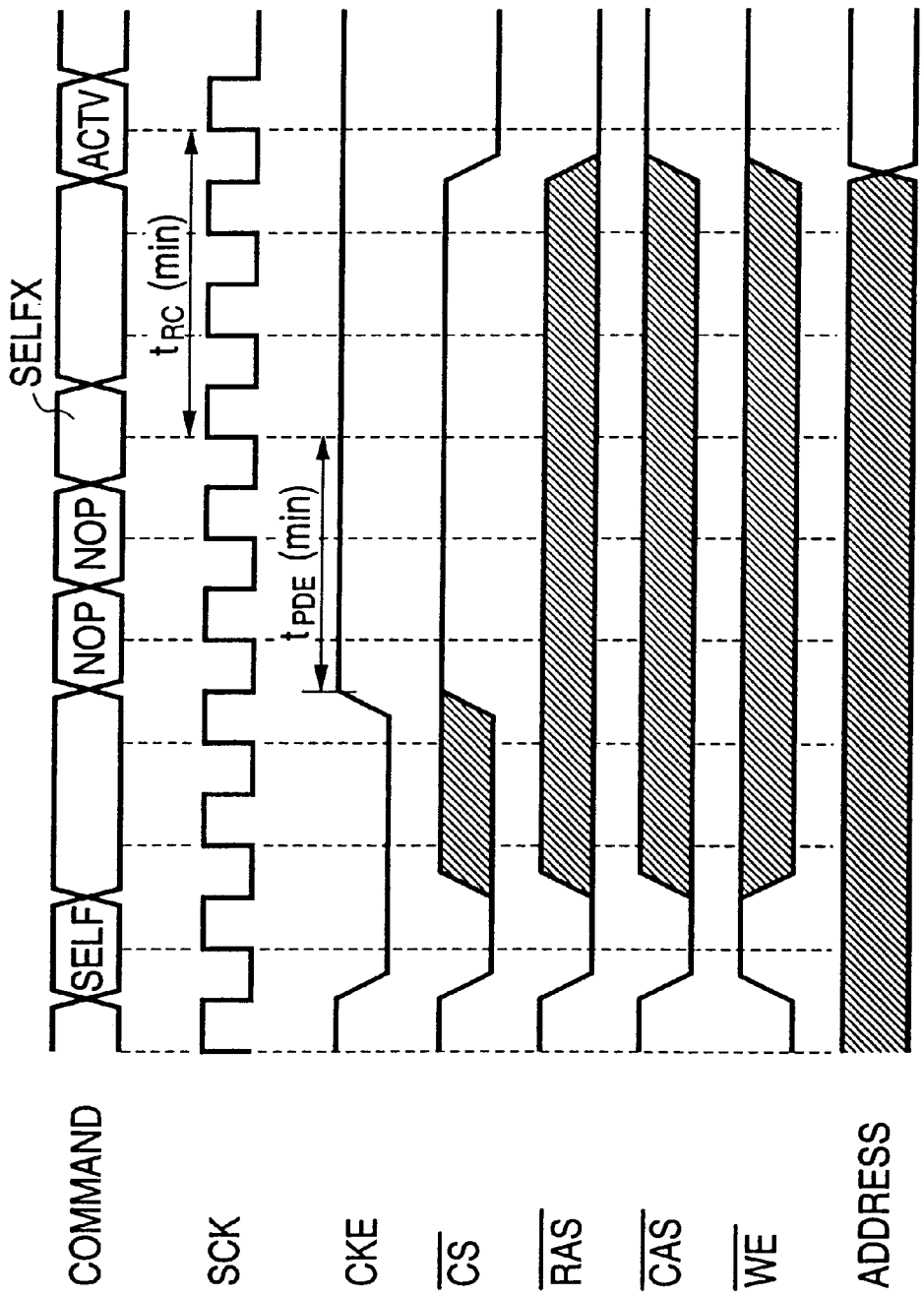
FIG. 2 is a timing chart showing a self refresh transfer command (SELF) and self refresh cancellation command (SELFX) of an SDRAM.

FIG. 2 is a timing chart showing issuance of a self refresh transfer command (SELF) and self refresh cancellation command (SELFX) to the SDRAMs 11 and 12 shown in FIG. 1. As will be described later, these commands are expressed by combinations of RAS, CAS, and WE.

Referring to FIG. 2, $t_{PDE}$ represents a CKE signal hold time upon completion of self refresh, and $t_{RC}$ represents a refresh active command delay time.

Figure 3:
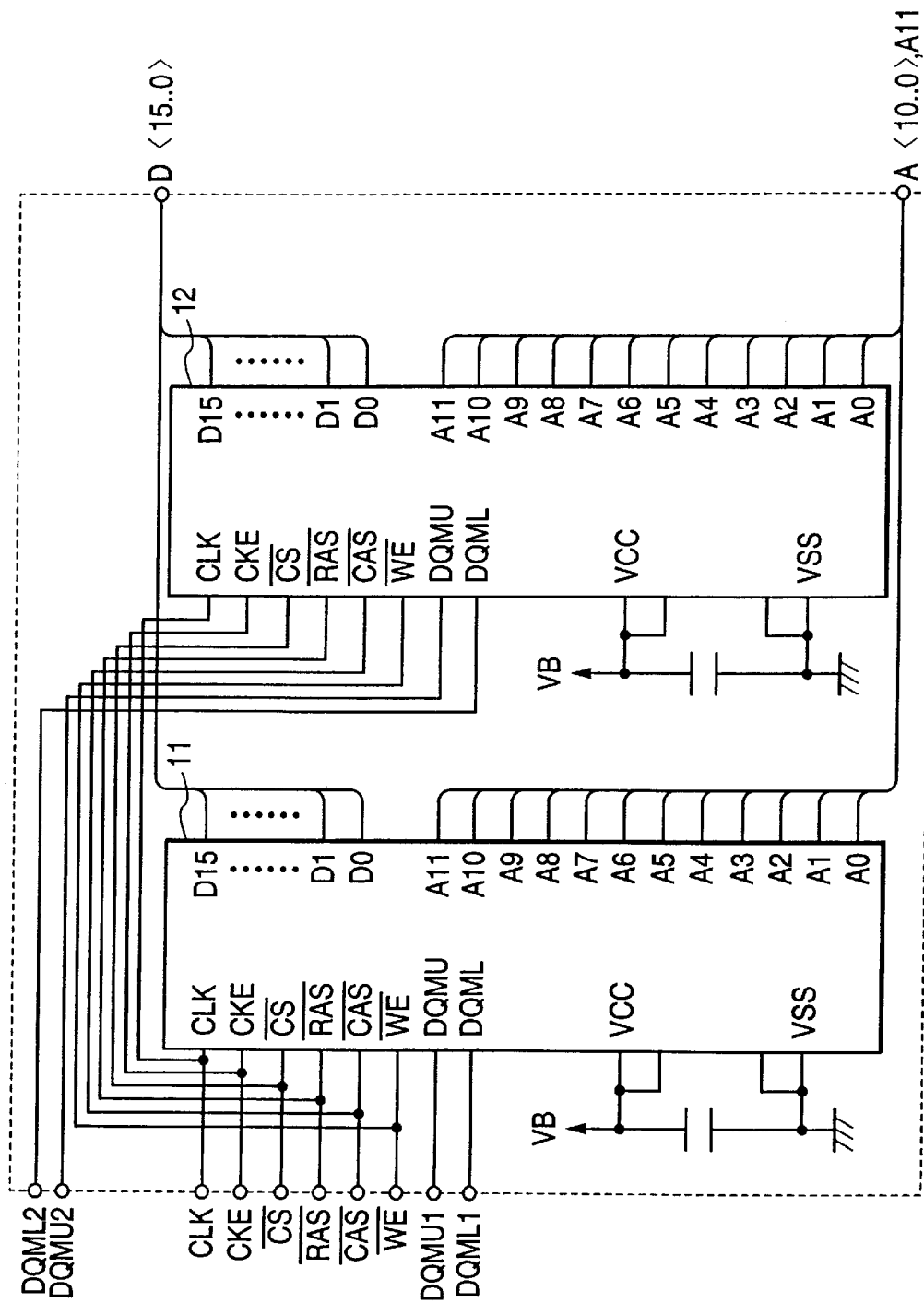
FIG. 3 is a circuit diagram showing the arrangement of the SDRAM in detail.

FIG. 3 is a circuit diagram showing the arrangement of the SDRAMs 11 and 12 shown in FIG. 1 in detail, and shows a 16-bit arrangement SDRAM as an example. Note that the same reference numerals in FIG. 3 denote the same parts as those in FIG. 1.

As shown in FIG. 3, in each of the SDRAMs 11 and 12, data I/Os at terminals D0 to D15 are controlled by a CLK terminal synchronous with the system clock SCK, CKE terminal, chip select terminal CS, row address strobe terminal RAS, column address strobe terminal CAS, write enable terminal WE, data I/O mask (DQML/DQMU) terminals, and address terminals A0 to A11. A terminal VB receives an output voltage from the backup power supply 7 or a voltage obtained by transforming the voltage from the backup power supply 7, and it receives a voltage from the main power supply 6 when the main power supply is ON.

The CS signal enables RAS, CAS, WE, and address inputs. In the SDRAM, RAS, CAS, and WE signals do not directly control SDRAM operation, and a combination of RAS, CAS, and WE defines SDRAM operation as a command in correspondence with CS in response to the leading edge of a clock.

The data I/O mask (DQML/DQMU) signals have a function of masking an input and disabling an output. The DQML signal controls data I/Os of lower bits (D0 to D7), and the DQMU signal controls data I/Os of upper bits (D8 to D15).

Figure 4:
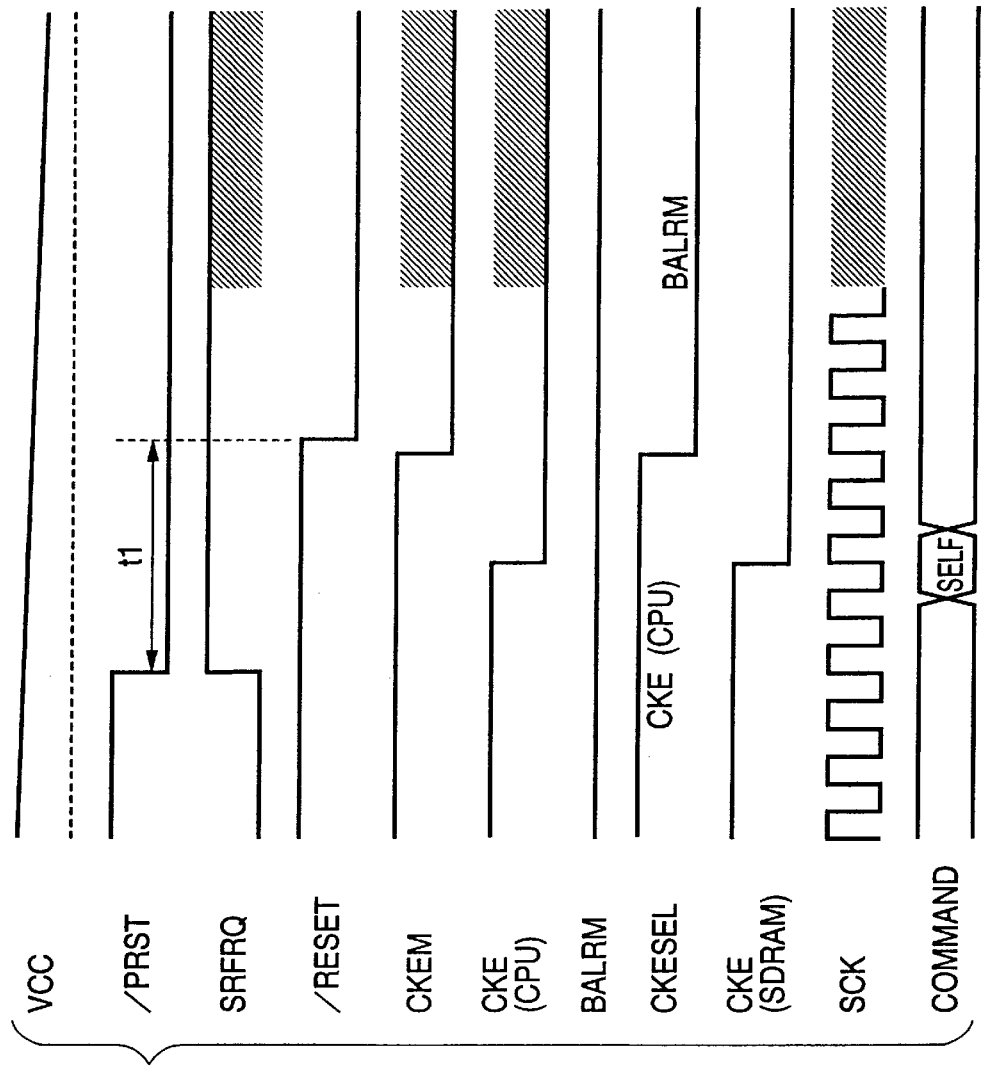
FIG. 4 is a timing chart showing transfer to backup operation upon power cutoff or power failure.

FIG. 4 is a timing chart showing transfer to backup operation upon power cutoff or power failure in the memory backup control apparatus according to this embodiment.

Referring to FIG. 4, when the main power supply 6 is turned off, and the power supply voltage VCC to the SDRAMs 11 and 12 decreases, the power supply voltage monitoring circuit 5 outputs a Low power supply voltage decrease detection signal (/PRST signal: / indicates negative logic), and the timing circuit 2 outputs a self refresh starting request (SRFRQ: High) to the CPU 1 in response to the Low /PRST signal.

When the CPU 1 changes the CKE signal to Low in synchronism with the leading edge of the clock upon receiving the self refresh starting request, since the selector 10 is connected to the CPU 1 side while the main power supply is ON, the CKE terminals of the SDRAMs 11 and 12 change to Low. At the same time, the CPU 1 outputs a self refresh transfer command (SELF) to the SDRAMs 11 and 12.

After self refresh of the SDRAMs 11 and 12 has been started up, the CPU 1 changes the CKEM signal to Low to change the CKESEL signal, as the output from the AND gate 13 that ANDs the CKEM signal and the reset signal from the reset output circuit 3, to Low, thus switching the selector 10 to the backup power supply side (BALRM). After that, the reset signal is changed to low, thus transferring to backup operation.

As shown in FIG. 4, time t1 between the Low timings of the /PRST and /RESET signals is set by the timing circuit 2 after the Low CKEM signal is output.

Figure 5:
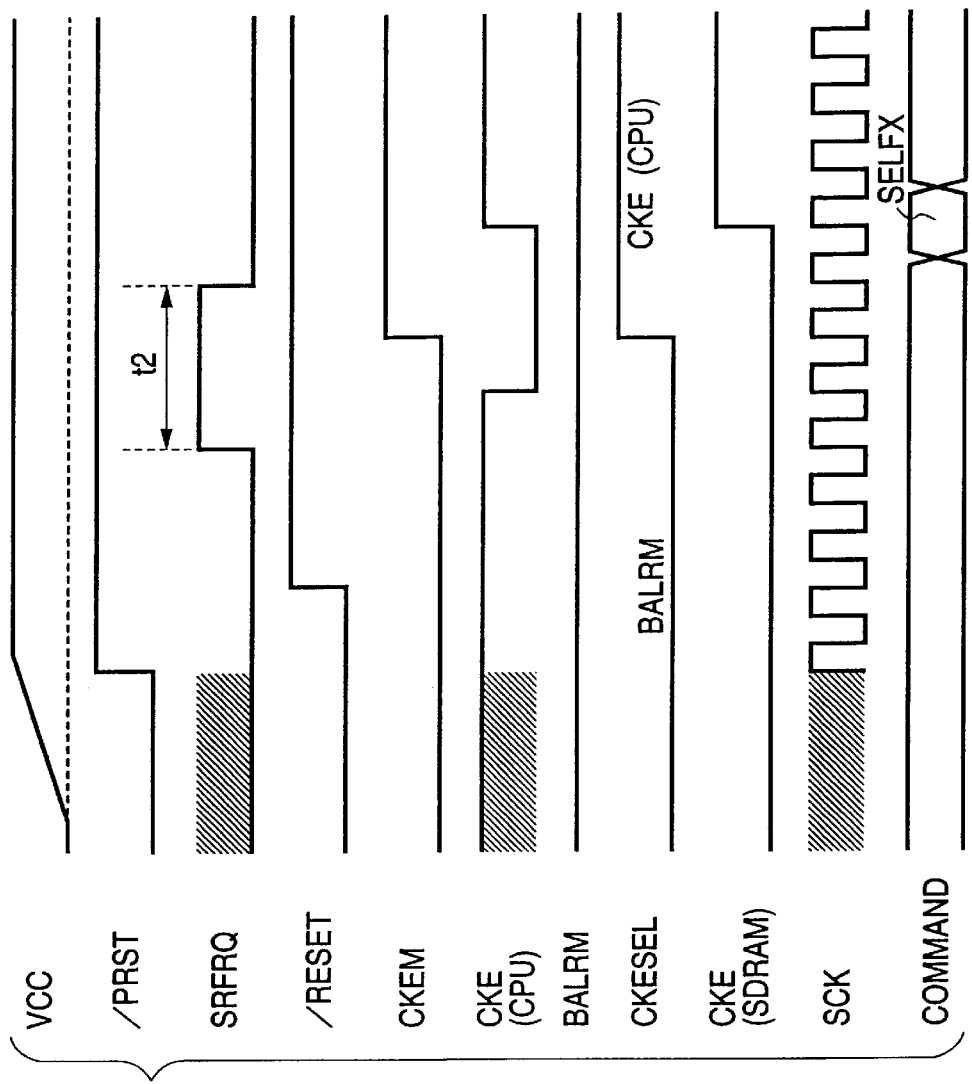
FIG. 5 is a timing chart showing recovery after power ON when backup operation is held.

FIG. 5 is a timing chart showing recovery after the power supply is turned on when backup operation is held in the memory backup control apparatus according to this embodiment.

As shown in FIG. 5, after the power supply 6 is turned on, when the power supply voltage monitoring circuit 5 detects recovery of the power supply voltage VCC, it cancels the /PRST signal (changes it to High), and the reset output circuit 3 cancels the /RESET signal (changes it to High) in response to this /PRST signal.

After the SDRAMs 11 and 12 are initially set, the timing circuit 2 outputs a self refresh starting request (SRFRQ:

High) to the CPU 1 while the selector 10 connects the CKE signal to the SDRAMs 11 and 12 to the backup side (BALRM). Upon receiving this self starting request, the CPU 1 outputs a Low CKE signal. After that, to cancel self refresh of the SDRAMs 11 and 12, the CPU 1 changes the CKEM signal to High to change the CKESEL signal to High, thus switching the selector 10 to the CPU 1 side.

The timing circuit 2 then outputs a self refresh cancellation request (SRFRQ: Low) to the CPU 1. Note that time t2 between the High and Low timings of the SRFRQ signal is set by the timing circuit 2 after the High CKEM signal is output.

Upon receiving the self refresh cancellation request, the CPU 1 changes the CKE signal to High, and outputs a self refresh cancellation command (SELFX), as shown in FIG. 2, thus recovering from backup operation.

Figure 6:
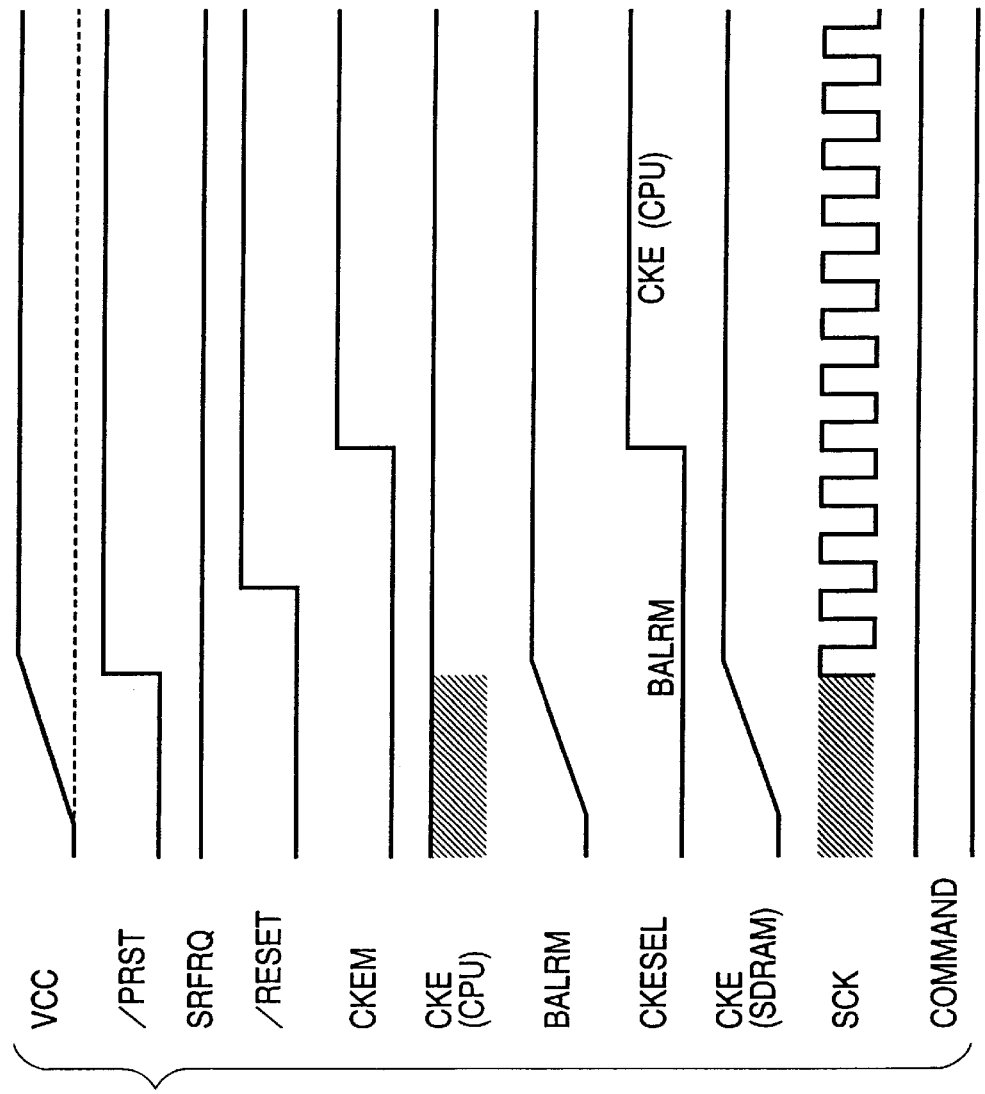
FIG. 6 is a timing chart showing recovery after power ON when backup operation is not held.

FIG. 6 is a timing chart showing recovery after the power supply is turned on when backup operation is not held in the memory backup control apparatus according to this embodiment.

As shown in FIG. 6, after the power supply 6 is turned on, when the power supply voltage monitoring circuit 5 detects recovery of the power supply voltage VCC, it cancels the /PRST signal to High, and the reset output circuit 3 cancels the /RESET signal to High in response to this /PRST signal. After the SDRAMs 11 and 12 are initially set, the CPU 1 changes the CKEM signal to High to change the CKESEL signal to High so as to switch the selector 10 to the CPU 1 side, thus completing initial setting.

Figure 7:
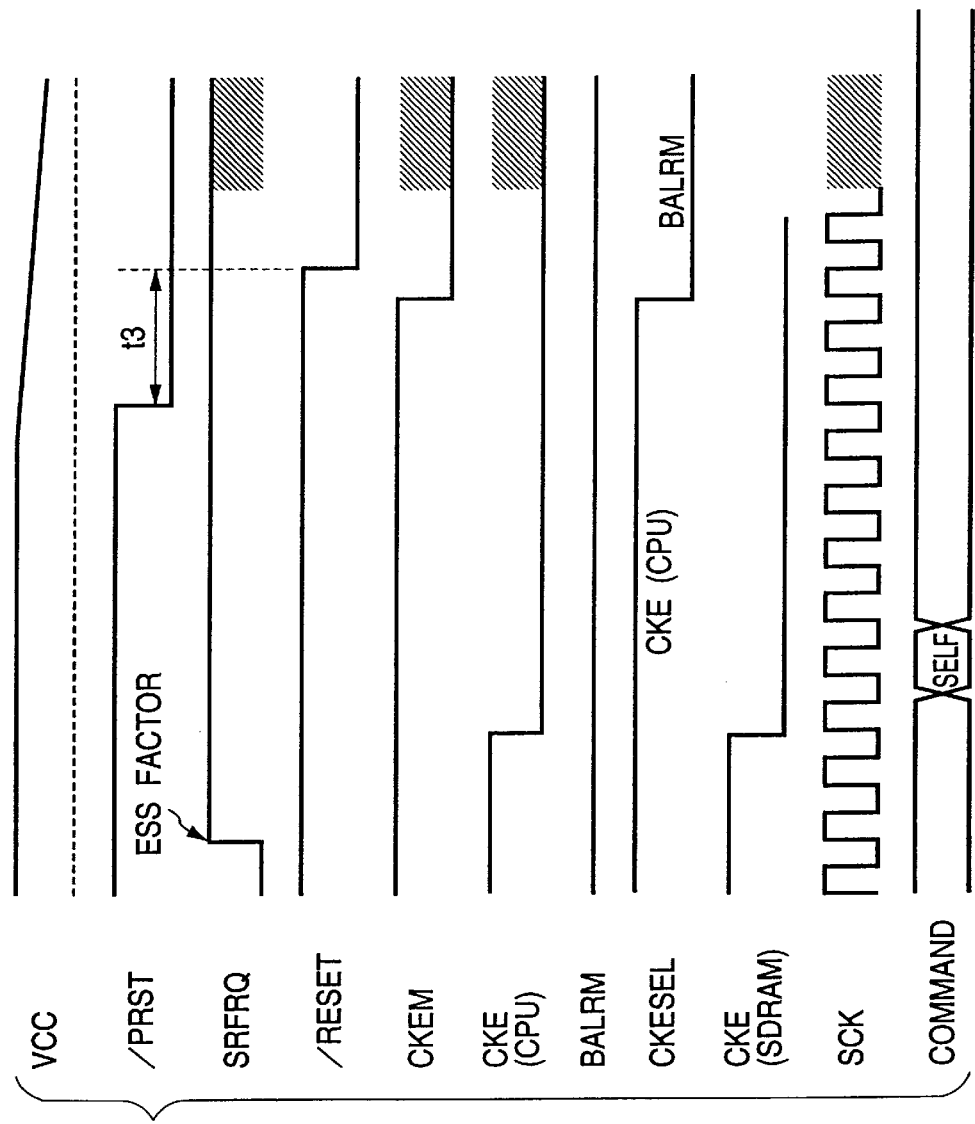
FIG. 7 is a timing chart showing transfer to backup operation upon transfer to a low energy consumption mode, and upon power cutoff or power failure.

FIG. 7 is a timing chart showing transfer to backup operation upon transfer to the low energy consumption mode or upon power cutoff or power failure in the memory backup control apparatus according to this embodiment.

As shown in FIG. 7, upon receiving a transfer factor (ESS factor) to the low energy consumption mode, the timing circuit 2 outputs a self refresh starting request (SRFRQ: High) to the CPU 1.

When the CPU 1 changes the CKE signal to Low in synchronism with the leading edge of the clock SCK in response to the self refresh starting request, since the selector 10 is connected to the CPU 1 side in a normal mode in which the main power supply 6 is ON, the CKE terminals of the SDRAMs 11 and 11 also change to Low. At the same time, the CPU 1 outputs a command (SELF), as shown in FIG. 2, thus starting self refresh of the SDRAMs 11 and 12.

When the main power supply 6 is turned off, and the power supply voltage VCC to the SDRAMs 11 and 12 decreases, the power supply voltage monitoring circuit 5 outputs a Low power supply voltage decrease detection signal (/PRST), and the timing circuit 2 checks based on the WDINH signal if the low energy consumption mode is selected. If the low energy consumption mode is selected, the CPU 1 changes the CKEM signal to Low to change the CKESEL signal, as the AND of the CKEM signal and reset signal obtained by the AND gate 13, to Low, thus switching the selector 10 to the backup power supply side (BALRM). After that, the reset signal is changed to Low, thus transferring to backup operation.

Note that time t3 between the Low timings of the /PRST and /RESET signals is set by the timing circuit 2 after the Low CKEM signal is output.

Figure 8:
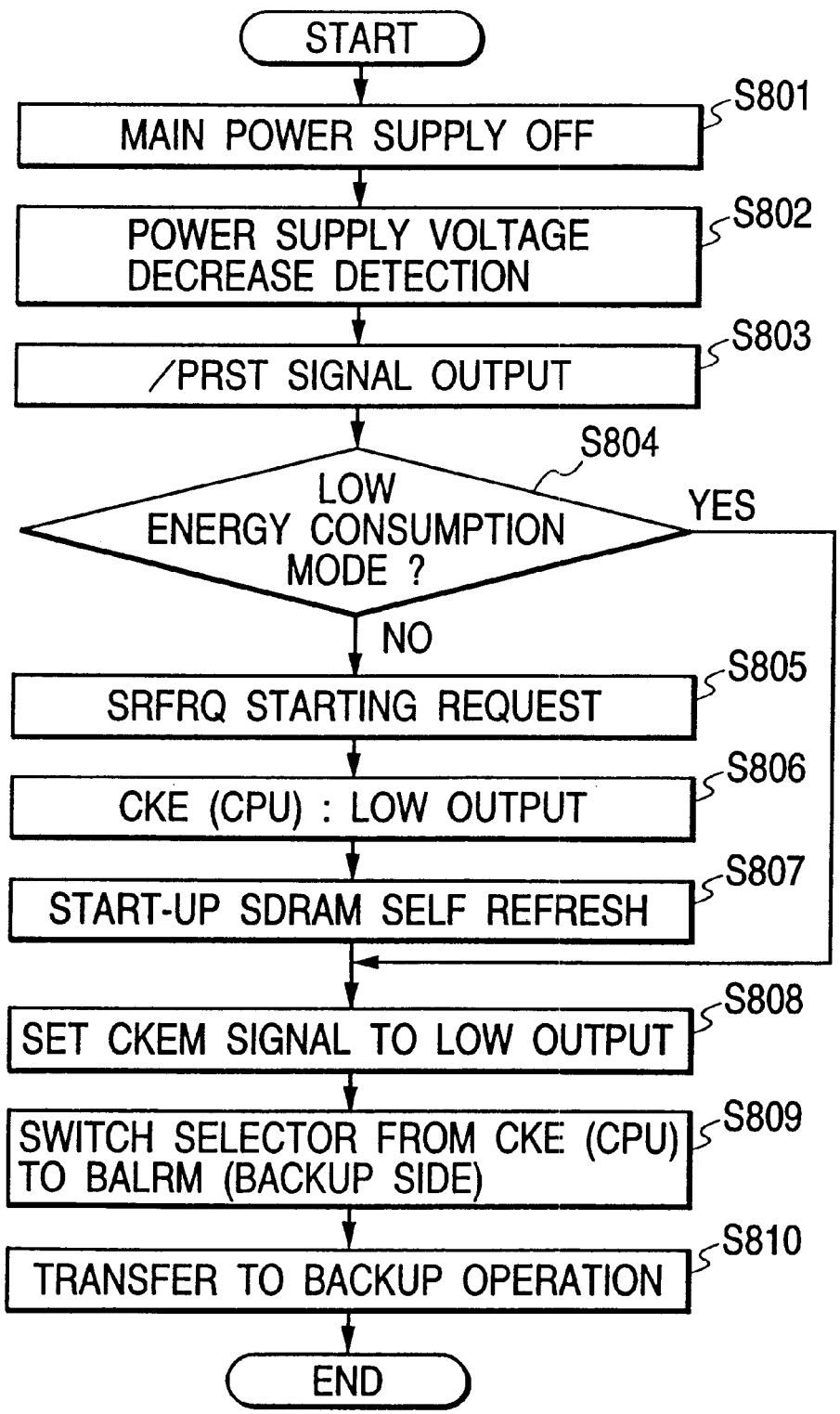
FIG. 8 is a flow chart showing an example of the processing sequence when a main power supply is cut off.

FIG. 8 is a flow chart showing an example of the processing sequence after the main power supply 6 is turned off in the memory backup control apparatus according to this embodiment. The memory backup control sequence after the main power supply 6 is turned off will be explained below with reference to the flow chart in FIG. 8.

If the main power supply 6 is turned off due to power failure or power cutoff in step S801, the power supply voltage monitoring circuit 5 detects a decrease in power supply voltage VCC to the SDRAMs 11 and 12 in step S802, and outputs a Low power supply voltage decrease detection signal (/PRST signal) in step S803.

In response to the Low /PRST signal, the timing circuit 2 checks based on the WDINH signal in step S804 if the low energy consumption mode (self refresh mode) is selected. If the low energy consumption mode is not selected, a self refresh starting request signal (SRFRQ: High) is output in step S805.

In response to the self refresh starting request, the CPU 1 changes the CKE signal to Low in synchronism with the leading edge of the clock in step S806. Since the selector 10 is connected to the CPU 1 side when the main power supply is ON, the CKE terminals of the SDRAMs 11 and 12 also change to Low. At the same time, the CPU 1 outputs a command (SELF) in step S807, as shown in FIG. 2, thus starting up SDRAM self refresh.

After self refresh has been started up, the CPU 1 changes the CKEM signal to Low to change the CKESEL signal, as the AND output of the CKEM signal and reset signal from the AND gate 13, to Low in step S808, and switches the selector 10 to the backup power supply side (BALRM) in step S809. After that, the reset signal is changed to Low in step S810, thus transferring to backup operation.

On the other hand, if it is discriminated in step S804 that the low energy consumption mode is selected, the flow advances to step S808 to switch the selector 10.

Figure 9:
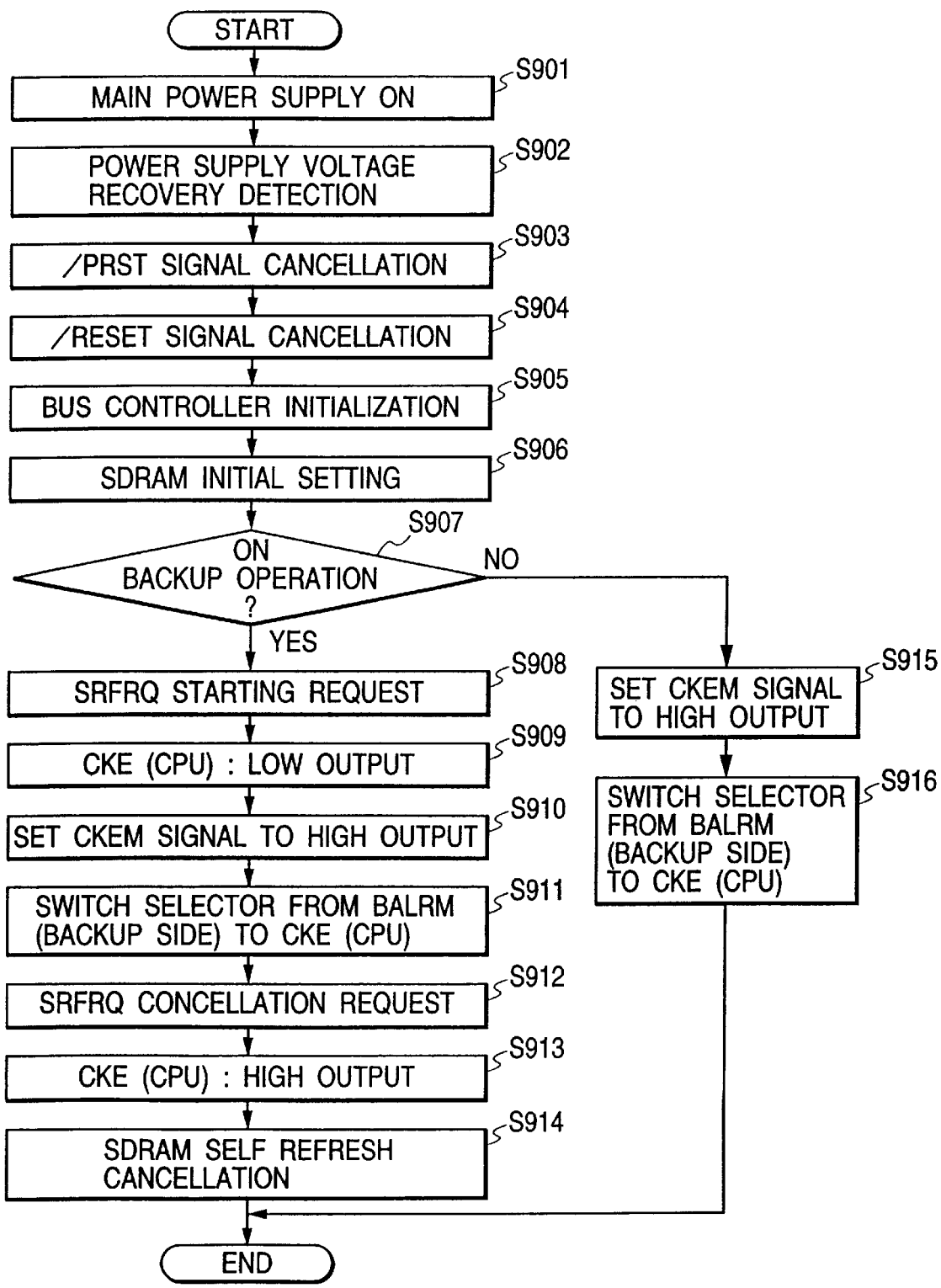

FIG. 9 is a flow chart showing an example of the data processing sequence after the main power supply 6 is turned on in the memory backup control apparatus according to this embodiment. The memory backup control sequence after the main power supply 6 is ON will be explained below with reference to the flow chart shown in FIG. 9.

After the main power supply 6 is turned on in step S901, if the power supply voltage monitoring circuit 5 detects recovery of the power supply voltage in step S902, it cancels the /PRST signal to High in step S903, and the reset output circuit 3 cancels the reset signal to High in response to this /PRST signal in step S904.

In step S905, the CPU 1 that serves as a bus controller is initialized. After the SDRAMs are initially set in step S906, it is checked based on the BALRM signal as the output from the comparison circuit 4 of the backup power supply 7 in step S907 if backup operation is held. If backup operation is underway (BALRM: Low), a self refresh starting request (SRFRQ: High) is output in step S908 while the selector 10 connects the CKE signal to be supplied to the SDRAMs 11 and 12 to the backup side (BALRM), so as to set only the system side in the self refresh mode. In response to the SRFRQ signal, the CPU 1 outputs a Low CKE signal in step S909.

After that, in order to cancel self refresh of the SDRAMs 11 and 12, the CPU 1 changes the CKEM signal to High to change the CKESEL signal to High in step S910, and switches the selector 10 from the backup side to the CPU 1 side in step S911.

In step S912, the timing circuit 2 outputs a self refresh cancellation request (SRFRQ: Low) to the CPU 1. In response to this self refresh cancellation request, the CPU 1 sets the CKE signal at High in step S913 to output a self refresh cancellation command, as shown in FIG. 2. In step S914, the system recovers from backup operation, thus ending initial setting.

On the other hand, if it is discriminated in step S907 that backup operation is not underway (BALRM: High), the CPU 1 changes the CKEM signal to High to change the CKESEL signal to High in step S915, and switches the selector 10 to the CPU 1 side in step S916, thus completing initial setting.

Note that some or all of circuits in a circuit group 18 (timing circuit 2, reset output circuit 3, and comparison circuit 4) in FIG. 1 may be constructed by a 1-chip gate array.

According to the memory backup control apparatus of the above embodiment, upon controlling refresh of the SDRAMs 11 and 12 upon receiving a voltage from the main power supply 6 or backup power supply 7, the power supply voltage monitoring circuit 5 detects a decrease in power supply voltage and outputs a power supply voltage decrease detection signal (/PRST signal), the timing circuit 2 outputs a self refresh starting request signal (SRFRQ: High) to the CPU 1 in response to this power supply voltage decrease detection signal, and the CPU 1 outputs a clock enable signal (CKE) and self refresh transfer command signal (SELF), which are synchronous with the system clock, thus starting up self refresh of the SDRAMs 11 and 12. Hence, the CBR timing of the RAS and CAS signals need not be generated by hardware or a gate array unlike the prior art, and a command signal synchronous with the clock is input in response to the self refresh starting request signal, thus realizing simple control and high-speed operation.

The reset output circuit 3 outputs a reset signal in response to the power supply voltage decrease detection signal, the comparison circuit 4 compares the voltage from the backup power supply 7 and a reference voltage to output a backup power supply voltage detection signal, the CPU 1 outputs a clock enable mask signal (CKEM) that masks the clock enable signal in response to completion of initial setting of the SDRAMs 11 and 12 based on the clock enable signal, and the selector 10 switches the clock enable inputs of the SDRAMs 11 and 12 from the clock enable signal of the CPU 1 side to the backup power supply voltage detection signal on the basis of the AND output CKESEL of the clock enable mask signal and the reset signal output from the reset output circuit 3. Hence, switching to the backup power supply side can be quickly done, thus improving reliability upon switching.

Furthermore, when the power supply voltage monitoring circuit 5 detects the recovery of the voltage of the main power supply 6 and cancels the power supply voltage decrease detection signal, the reset output circuit 3 cancels the reset signal. After the CPU 1 and SDRAMs 11 and 12 are initialized, the timing circuit 2 checks based on the BALRM signal as the output from the comparison circuit 4 of the backup power supply 7 if backup operation is underway. If it is discriminated that backup operation is underway, the CPU 1 outputs a Low CKE signal and then changes the CKEM signal to High to change the CKESEL signal to High, thus switching the selector 10 from the backup power supply side to the CPU 1 side. The timing circuit 2 outputs a self refresh cancellation request signal a predetermined period of time after it outputs the self refresh starting request signal. Hence, the processes in response to the self refresh starting and cancellation requests on the system side can be standardized and can be prevented from diversifying, thereby improving the reliability of the recovery process when the power supply is ON.

Upon transferring to the low energy consumption mode that can reduce energy consumption compared to normal operation, the CPU 1 outputs a clock enable signal synchronous with the system clock in response to a self refresh starting request signal to start up self refresh of the SDRAMs 11 and 12 on the basis of the clock enable signal and command signal. Hence, even when the power supply is cut off in the low energy consumption mode, backup operation can be quickly started.

Furthermore, when the voltage from the main power supply 6 decreases and the power supply voltage decrease detection signal is output in the low energy consumption mode, the clock enable signal is switched to the backup power supply voltage detection signal in accordance with the logic conditions of the clock enable signal and the clock enable mask signal. Hence, the switching timing is generated before the self refresh starting request is output, and the processes in response to the self refresh starting and cancellation requests on the system side can be standardized and can be prevented from diversifying. Also, the processing sequence from power ON until recovery from backup operation can be quickly done, thus improving the reliability of the backup recovery process.

Moreover, the self refresh mode can be quickly set even in the low energy consumption mode, thus further contributing to low energy consumption of the system.

In addition, in a system that uses clock synchronous type synchronous DRAMs that can achieve high-speed memory control, high-speed transfer/recovery control and high reliability of memory backup operation can be achieved.

In the above embodiment, the CPU 1 controls memory access to the SDRAMs 11 and 12. Also, the same effects can be obtained when the present invention is applied to a case wherein, for example, a bus controller (comprising a gate array chip having a bus controller function or the like) solely controls memory access to the SDRAMs 11 and 12 in place of the CPU 1.

Also, the self refresh mode can be quickly set even in the low energy consumption mode, thus further contributing to low energy consumption of the system.

Further, in a system that uses clock synchronous type synchronous DRAMs that can achieve high-speed memory control, high-speed transfer/recovery control and high reliability of memory backup operation can be achieved.

Figure 10:
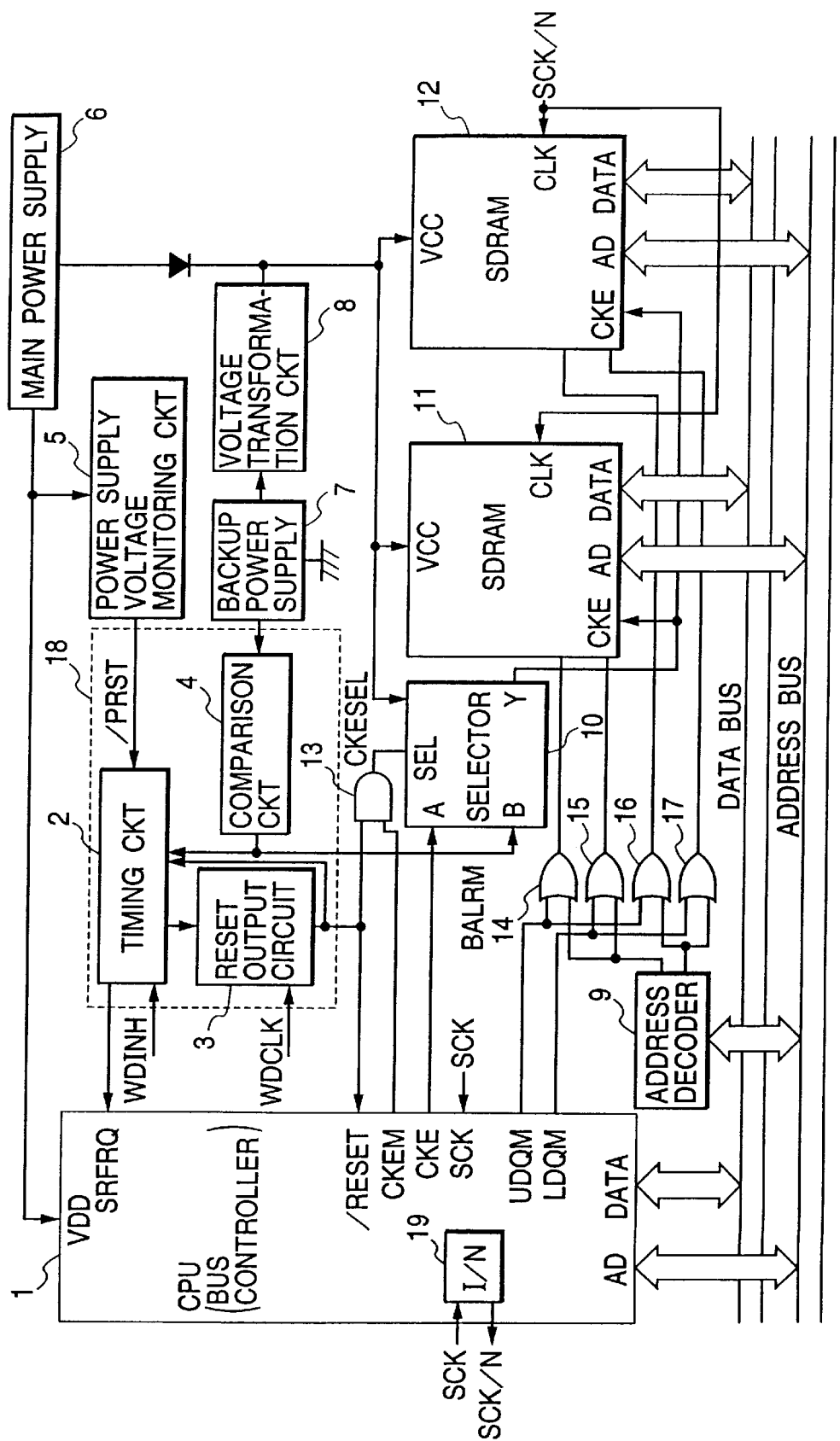
FIG. 10 is a block diagram showing the arrangement of a memory backup control apparatus according to another embodiment of the present invention.

FIG. 10 is a block diagram showing the arrangement of a memory backup control apparatus according to another embodiment.

The difference between the memory backup control apparatus shown in FIG. 10, and that shown in FIG. 1 is that the apparatus shown in FIG. 10 uses a clock obtained by frequency-dividing the system clock SCK in place of the system clock SCK itself, as a clock for the SDRAMs.

Referring to FIG. 10, a frequency divider 19 frequency-divides the system clock SCK to 1/N, and supplies the frequency-divided clock SCK/N to the clock input terminals CLK of the SDRAMs 11 and 12. Other components are the same as those in FIG. 1. With this arrangement, the CKE signal changes to Low in synchronism with the leading edge of the frequency-divided clock SCK/N.

The processing sequence in the memory backup control apparatus with the arrangement shown in FIG. 10 will be explained below with reference to FIGS. 8 and 9. Note that only differences from the above embodiment will be explained.

When the main power supply is OFF, the CPU 1 sets the frequency-divided clock SCK/N of the SDRAMs 11 and 12 in accordance with a self refresh starting request, and changes the CKE signal to Low in synchronism with the leading edge of the frequency-divided clock SCK/N in step S806 in FIG. 8. Since the selector 10 is connected to the CPU 1 side while the main power supply is ON, the CKE terminals of the SDRAMs 11 and 12 also change to Low. Other processes in FIG. 8 are the same as those in the above embodiment.

After the main power supply is turned on, the CPU 1 sets the frequency-divided clock SCK/N of the SDRAMs 11 and 12 in response to the SRFRQ signal, and changes the CKE signal to Low in synchronism with the leading edge of the frequency-divided clock SCK/N in step S909 in FIG. 9. In step S914, the control recovers from backup operation, and the frequency-divided clock SCK/N of the SDRAMs 11 and 12 is set, thus completing initial setting. Other processes in FIG. 9 are the same as those in the above embodiment.

Although the present invention has been described in its preferred form with a certain degree of particularity, many apparently widely different embodiments of the invention can be made without departing from the spirit and scope thereof. It is to be understood that the invention is not limited to the specific embodiments thereof except as defined in the appended claims.

What is claimed is:

1. An apparatus for controlling backup of a memory upon receiving a voltage from a main power supply or backup power supply, comprising:

power supply voltage decrease detection means for detecting a decrease in voltage from the main power supply and outputting a voltage decrease detection signal;

self refresh starting request means for outputting a self refresh starting request signal in response to the voltage decrease detection signal; and start-up control means for outputting a clock enable signal, and a self refresh transfer command signal, which is expressed by a combination of control signal line states with respect to the memory, to the memory in response to the self refresh starting request signal, so as to start up self refresh of the memory.

2. An apparatus according to claim 1, wherein said start-up control means outputs the clock enable signal in synchronism with a system clock.

3. An apparatus according to claim 1, wherein said start-up control means generates a frequency-divided clock obtained by frequency-dividing a system clock, and outputs the clock enable signal in synchronism with the frequency-divided clock.

4. An apparatus according to claim 1, further comprising:

reset means for outputting a reset signal in response to the voltage decrease detection signal;

clock enable mask signal output means for outputting a clock enable mask signal that masks the clock enable signal, after the self refresh has been started up;

comparison output means for comparing a voltage from the backup power supply and a reference voltage, and outputting a backup power supply voltage detection signal; and selection means for selecting one of the clock enable signal from said start-up control means and the backup power supply voltage detection signal, as a clock enable signal to be supplied to the memory, on the basis of logic conditions of the reset signal and clock enable mask signal.

5. An apparatus according to claim 4, wherein said reset means outputs the reset signal after the clock enable mask signal is output.

6. An apparatus according to claim 4, further comprising:

mode discrimination means for discriminating if a low energy consumption mode is selected; and refresh control means for controlling said self refresh starting request means to suppress output of the self refresh starting request signal and controlling the clock enable mask signal output means to output the clock enable mask signal without starting up the self refresh, when said mode discrimination means discriminates that the low energy consumption mode is selected.

7. An apparatus according to claim 4, further comprising:

voltage recovery detection means for detecting recovery of the voltage from the main power supply, and canceling the voltage decrease detection signal; and reset signal cancellation means for canceling the reset signal in response to cancellation of the voltage decrease detection signal, wherein after the reset signal is canceled, said self refresh starting request means outputs the self refresh starting request signal, said clock enable mask signal output means changes status of the clock enable mask signal after the self refresh has been started up in response to the self refresh starting request signal, and said selection means switches the clock enable signal to be supplied to the memory from the backup power supply voltage detection signal to the clock enable signal output from said start-up control means.

8. An apparatus according to claim 7, wherein said self refresh starting request means outputs a self refresh cancellation request signal a predetermined period of time after the self refresh starting request signal is output, and said start-up control means cancels the clock enable signal in response to the self refresh cancellation request signal and outputs a self refresh cancellation command signal, which is expressed by a combination of control signal line states with respect to the memory, so as to cancel the self refresh of the memory.

9. An apparatus according to claim 7, further comprising:

backup discrimination means for discriminating if backup operation is underway; and backup control means for controlling said self refresh starting request means to suppress output of the self refresh starting request signal and controlling said clock enable mask signal output means to change status of the clock enable mask signal without starting up the self refresh, when said backup discrimination means discriminates that backup operation is not underway.

10. An apparatus according to claim 9, wherein said backup discrimination means discriminates based on the backup power supply voltage detection signal if backup operation is underway.

11. A method for controlling backup of a memory upon receiving a voltage from a main power supply or backup power supply, comprising the steps of:

detecting a decrease in voltage from the main power supply and outputting a voltage decrease detection signal;

outputting a self refresh starting request signal in response to the voltage decrease detection signal; and outputting a clock enable signal, and a self refresh transfer command signal, which is expressed by a combination of control signal line states with respect to the memory, to the memory in response to the self refresh starting request signal, so as to start up self refresh of the memory.

12. A method according to claim 11, wherein the start-up step includes the step of outputting the clock enable signal in synchronism with a system clock.

13. A method according to claim 11, wherein the start-up step includes the step of generating a frequency-divided clock obtained by frequency-dividing a system clock, and outputting the clock enable signal in synchronism with the frequency-divided clock.

14. A method according to claim 11, further comprising the steps of:

outputting a clock enable mask signal that masks the clock enable signal, after the self refresh has been started up;

outputting a reset signal in response to the voltage decrease detection signal;

comparing a voltage from the backup power supply and a reference voltage, and outputting a backup power supply voltage detection signal; and selecting one of the clock enable signal based on the self refresh starting request signal, and the backup power supply voltage detection signal, as a clock enable signal to be supplied to the memory, on the basis of logic conditions of the reset signal and clock enable mask signal.

15. A method according to claim 14, wherein the reset signal is output after the clock enable mask signal is output.

16. A method according to claim 14, further comprising the steps of:

discriminating if a low energy consumption mode is selected; and suppressing output of the self refresh starting request signal and outputting the clock enable mask signal without starting up the self refresh, when it is discriminated that the low energy consumption mode is selected.

17. A method according to claim 14, further comprising the steps of:

detecting recovery of the voltage from the main power supply, and canceling the voltage decrease detection signal;

canceling the reset signal in response to cancellation of the voltage decrease detection signal;

outputting the self refresh starting request signal after the reset signal is canceled;

changing status of the clock enable mask signal after the self refresh has been started up in response to the self refresh starting request signal; and switching the clock enable signal to be supplied to the memory from the backup power supply voltage detection signal to the clock enable signal based on the self refresh starting request signal.

18. A method according to claim 17, further comprising the steps of:

outputting a self refresh cancellation request signal a predetermined period of time after the self refresh starting request signal is output; and canceling the clock enable signal in response to the self refresh cancellation request signal and outputting a self refresh cancellation command signal, which is expressed by a combination of control signal line states with respect to the memory, so as to cancel the self refresh of the memory.

19. A method according to claim 17, further comprising the steps of:

discriminating if backup operation is underway; and suppressing output of the self refresh starting request signal and changing status of the clock enable mask signal without starting up the self refresh, when it is discriminated that backup operation is not underway.

20. A method according to claim 19, wherein whether or not backup operation is underway is discriminated based on the backup power supply voltage detection signal.

* * * * *